(12) United States Patent
Park et al.

(10) Patent No.: US 12,063,811 B2
(45) Date of Patent: Aug. 13, 2024

(54) ELECTROLUMINESCENCE DISPLAY HAVING EXTERNAL LIGHT REFLECTION PREVENTING FILM

(71) Applicant: LG DISPLAY CO., LTD., Seoul (KR)

(72) Inventors: Suhyun Park, Paju-si (KR); HyunJong Noh, Paju-si (KR); Jinhyung Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 403 days.

(21) Appl. No.: 17/542,576

(22) Filed: Dec. 6, 2021

(65) Prior Publication Data
US 2022/0209205 A1    Jun. 30, 2022

(30) Foreign Application Priority Data
Dec. 29, 2020  (KR) .................. 10-2020-0185518

(51) Int. Cl.
*H10K 50/86* (2023.01)
*H10K 50/80* (2023.01)
*H10K 50/844* (2023.01)
*H10K 59/38* (2023.01)

(52) U.S. Cl.
CPC ......... *H10K 50/865* (2023.02); *H10K 50/844* (2023.02); *H10K 50/868* (2023.02); *H10K 59/38* (2023.02)

(58) Field of Classification Search
CPC .... H10K 50/865; H10K 59/38; H10K 50/844; H10K 50/868
USPC .......................................................... 257/40
See application file for complete search history.

(56) References Cited

U.S. PATENT DOCUMENTS

| | | | |
|---|---|---|---|
| 9,117,776 B2 | 8/2015 | Kim et al. | |
| 2015/0028294 A1* | 1/2015 | Kim | H10K 59/38 257/40 |
| 2019/0181189 A1* | 6/2019 | Chang | H10K 50/865 |
| 2022/0102687 A1* | 3/2022 | Wang | G02B 5/3016 |
| 2023/0165114 A1* | 5/2023 | Chen | H10K 59/50 257/40 |

FOREIGN PATENT DOCUMENTS

KR    2015-0012591 A    2/2015

* cited by examiner

*Primary Examiner* — Nduka E Ojeh
(74) *Attorney, Agent, or Firm* — POLSINELLI PC

(57) ABSTRACT

An electroluminescence display includes a substrate including a plurality of pixels, each pixel having an emission area and a non-emission area; a light emitting diode disposed in the emission area on the substrate; an encapsulation layer covering the light emitting diode; and a pattern layer including a light transmitting area corresponding to the emission area and a light blocking area corresponding to the non-emission area, and disposed at a first direction from the substrate, wherein the first direction is corresponding to a light emitting direction of light which is generated by the light emitting diode, thereby reducing reflection of external light.

14 Claims, 9 Drawing Sheets

ELECTROLUMINESCENCE DISPLAY HAVING EXTERNAL LIGHT REFLECTION PREVENTING FILM

CROSS-REFERENCE TO RELATED APPLICATION

This application claims the priority of the Korean Patent Application No. 10-2020-0185518 filed on Dec. 29, 2020, which is hereby incorporated by reference in its entirety as if fully set forth herein.

BACKGROUND

Field of the Disclosure

The present disclosure relates to an electroluminescence display reducing the reflection of the external lights. In particular, the present disclosure relates to an electroluminescence display that prevents reflection of external light without a polarizing (optical) element.

Description of the Background

Recently, various type of display such as cathode ray tubes (CRTs), liquid crystal displays (LCDs), plasma display panels (PDPs) and electroluminescent displays have been developed. These types of displays are used to display image data for various products such as computers, mobile phones, bank deposit and withdrawal devices (ATMs), and vehicle navigation systems according to their unique characteristics and purposes.

In particular, the electroluminescent display, which is a self-luminous display, has an excellent optical performance in terms of viewing angle and color realization degree for example, so that its application field is gradually widening and is receiving attention as an image display device. The electroluminescence display has excellent color reproducibility and therefore it is in the spotlight as the most excellent device among the currently developed flat panel display devices.

In the case of the flat panel display such as an electroluminescence display, there is a problem that external light is reflected, so that the display quality is deteriorated. In order to suppress the external light reflection, a method of applying an optical element such as a polarizing film or sheet has been proposed. However, since the amount of light provided by the light emitting material is reduced due to the optical element, a decrease in luminance occurs. In order to prevent luminance degradation, higher power should be used, which causes an increase in power consumption. Therefore, it is required to develop a new technology for suppressing external light reflection without applying an optical element causing degradation of luminance of the display.

SUMMARY

The present disclosure, as for solving the problems described above, is to provide an electroluminescence display suppressing external light reflection without degradation of luminance of the display.

The present disclosure is also to provide an electroluminescence display reducing the external light reflection without any optical element, and preventing the deteriorate of the luminance of the display.

In order to accomplish the above mentioned, an electroluminescence display according to an aspect of the present disclosure comprises: a substrate including a plurality of pixels, each pixel having an emission area and a non-emission area; a light emitting diode disposed in the emission area on the substrate; an encapsulation layer covering the light emitting diode; and a pattern layer including a light transmitting area corresponding to the emission area and a light blocking area corresponding to the non-emission area and disposed at a first direction from the substrate, wherein the first direction is corresponding to a light emitting direction of light which is generated by the light emitting diode.

In one aspect, the pattern layer includes a non-liquid crystal dye which transmits visible light as a length of a conjugated structure is shortened by irradiating an ultraviolet light of a specific wavelength. The light transmitting area has a first transmittance of visible light of 50% or more by shortening the length of the conjugated structure of the non-liquid crystal dye. The light blocking area has a second transmittance of visible light of 25% or less by maintaining the length of the conjugated structure of the non-liquid crystal dye.

In one aspect, the specific wavelength of the ultraviolet light may be selected from a wavelength range of 300 nm to 370 nm.

In one aspect, the non-liquid crystal dye includes a first dye, a second dye and a third dye. Before irradiating the ultraviolet light, the first dye has a first light absorption rate of 75% or more with respect to the visible light in a wavelength band of 380 nm to 480 nm, the second dye has a second light absorbing rate of 75% or more with respect to the visible light in a wavelength band of 480 nm to 600 nm, and the third dye has a third light absorbing rate of 75% or more with respect to the visible light in a wavelength band of 600 nm to 750 nm.

In one aspect, after irradiating the ultraviolet light, the first dye has the first transmittance of 50% to 99% with respect to the visible light in the wavelength band of 380 nm to 480 nm, the second dye has the second transmittance of 50% to 99% with respect to the visible light in the wavelength band of 480 nm to 600 nm, and the third dye has the third transmittance of 50% to 99% with respect to the visible light in the wavelength band of 600 to 750 nm.

In one aspect, the non-liquid crystal dye includes azo dye.

In one aspect, the electroluminescence display further comprises: an ultraviolet light blocking layer disposed at the first direction from the pattern layer.

In one aspect, the electroluminescence display further comprises: an oxygen preventing layer disposed between the pattern layer and the ultraviolet light blocking layer.

In one aspect, the electroluminescence display further comprises: an optical film disposed between the pattern layer and the ultraviolet light blocking layer.

In one aspect, the optical film includes any one of a polarizing layer and a light absorbing layer.

In one aspect, the light emitting diode emits light to a direction where the substrate is disposed. The pattern layer is disposed under a lower surface of the substrate.

In one aspect, the light emitting diode emits light to a direction where the encapsulation layer is disposed. The pattern layer is disposed on a top surface of the encapsulation layer.

In one aspect, the pattern layer further includes a light absorbing material.

The electroluminescent display according to the present disclosure does not have a problem that the light incident from the outside is reflected and thus the display quality is deteriorated. The electroluminescence display according to the present disclosure may minimize the decrease in the luminance of the light emitted by the self-luminous element while suppressing or reducing the external light reflection. Accordingly, interference due to the external light reflection on display light may be minimized or eliminated, and high luminance of display light may be ensured with low power consumption.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principle of the disclosure.

In the drawings.

DETAILED DESCRIPTION

Figure 1:
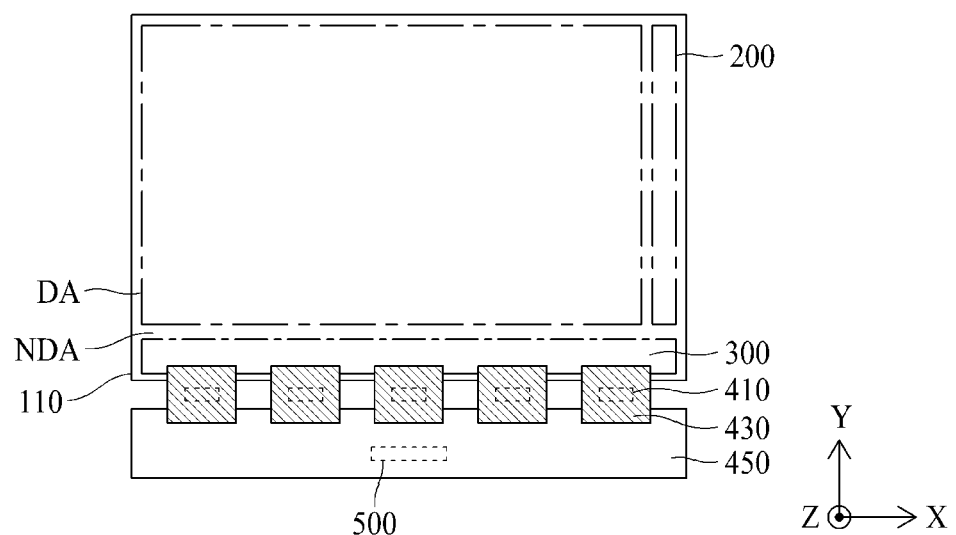
FIG. 1 is a diagram illustrating a schematic structure of an electroluminescence display according to the present disclosure.

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terms are not limited in nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, it is not limited to the scale shown in the drawings. FIG. 1 is a diagram illustrating a schematic structure of an electroluminescence display according to the present disclosure. In FIG. 1, X-axis may be parallel to the extending direction of the scan line, Y-axis may be parallel to the extending direction of the data line, and Z-axis may represent the thickness direction of the display.

Referring to FIG. 1, the electroluminescence display comprises a substrate 110, a gate (or scan) driver 200, a data pad portion 300, a source driving IC (Integrated Circuit) 410, a flexible film 430, a circuit board 450, and a timing controller 500.

The substrate 110 may include an electrical insulating material or a flexible material. The substrate 110 may be made of glass, metal or plastic, but it is not limited thereto. When the electroluminescence display is a flexible display, the substrate 110 may be made of the flexible material such as plastic. For example, the substrate 110 may include a transparent polyimide material.

The substrate 110 may include a display area DA and a non-display area NDA. The display area DA, which is an area for representing the video images, may be defined as the majority central area of the substrate 110, but it is not limited thereto. In the display area DA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area not representing the video images, may be defined at the circumference areas of the substrate 110 surrounding all or a portion of the display area DA. In the non-display area NDA, the gate driver 200 and the data pad portion 300 may be formed or disposed.

The gate driver 200 may supply the scan (or gate) signals to the scan lines according to the gate control signal received from the timing controller 500. The gate driver 200 may be formed at the non-display area NDA which may be located at any one side of the display area DA on the substrate 110, as a GIP (Gate In Panel) type. GIP type means that the gate driver 200 is directly formed on the substrate 110.

The data pad portion 300 may supply the data signals to the data line according to the data control signal received from the timing controller 500. The data pad portion 300 may be made as a driver chip and mounted on the flexible film 430. Further, the flexible film 430 may be attached at the non-display area NDA which may be located at any one side of the display area DA on the substrate 110, as a TAB (Tape Automated Bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (Chip On Film) or COP (Chip On Plastic) type.

The flexible film 430 may include a plurality of first link lines connecting the data pad portion 300 to the source driving IC 410, and a plurality of second link lines connecting the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Figure 2:
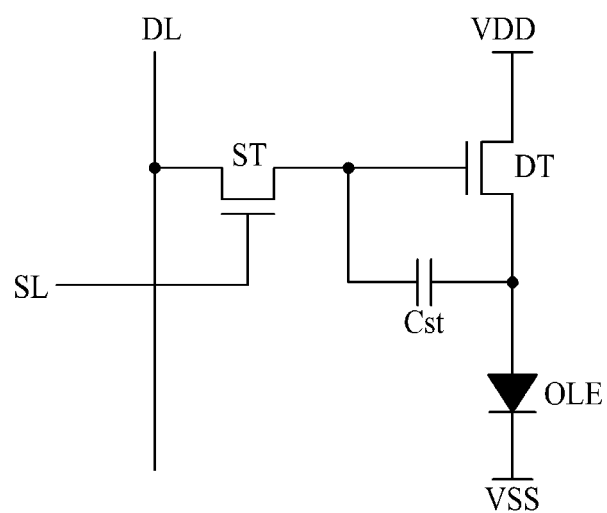
FIG. 2 is a circuit diagram illustrating a structure of one pixel according to the present disclosure.
Figure 3:
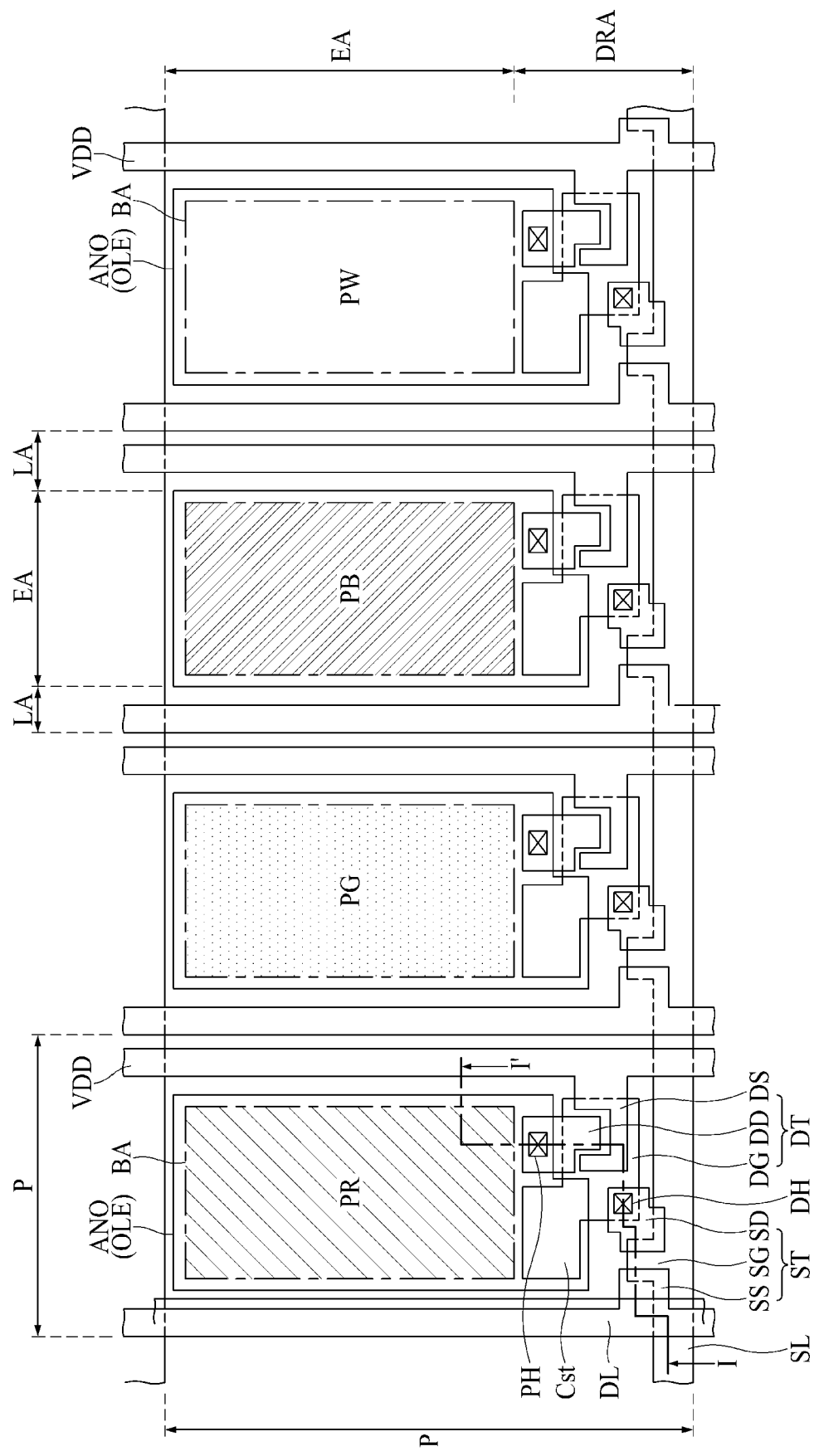
FIG. 3 is a plan view illustrating a structure of the pixels according to the present disclosure.

FIG. 2 is a circuit diagram illustrating a structure of one pixel according to the present disclosure. FIG. 3 is a plan view illustrating a structure of the pixels according to the present disclosure.

Referring to FIGS. 2 to 3, an electroluminescence display according to the present disclosure may include a plurality of pixels P arrayed in a matrix manner. One pixel P of the electroluminescence display may be defined by a scan line SL, a data line DL and a driving current line VDD. One pixel P of the electroluminescence display may include subpixels representing one of primary colors. For example, one pixel P may include a red pixel PR emitting red light, a green pixel PG emitting green light and a blue pixel PB emitting blue light. For another example, a white pixel PW emitting white light may be further included into the pixel P.

Referring to FIGS. 2 to 3, an electroluminescence display according to the present disclosure may include a plurality of pixels P arrayed in a matrix manner. One pixel P of the electroluminescence display may be defined by a scan line SL, a data line DL and a driving current line VDD. One pixel P of the electroluminescence display may include a switching thin film transistor ST, a driving thin film transistor DT, a light emitting diode OLE and a storage capacitance Cst. The driving current line VDD may be supplied with a high-level voltage for driving the light emitting diode OLE. The area in which the lines SL, DL and VDD are disposed may be defined as a line area LA, and the area in which the thin film transistors ST and DT are disposed may be defined as a driving area DRA. Further, the area in which the light emitting diode OLE is disposed may be defined as an emission area EA.

First Aspect

Figure 4:
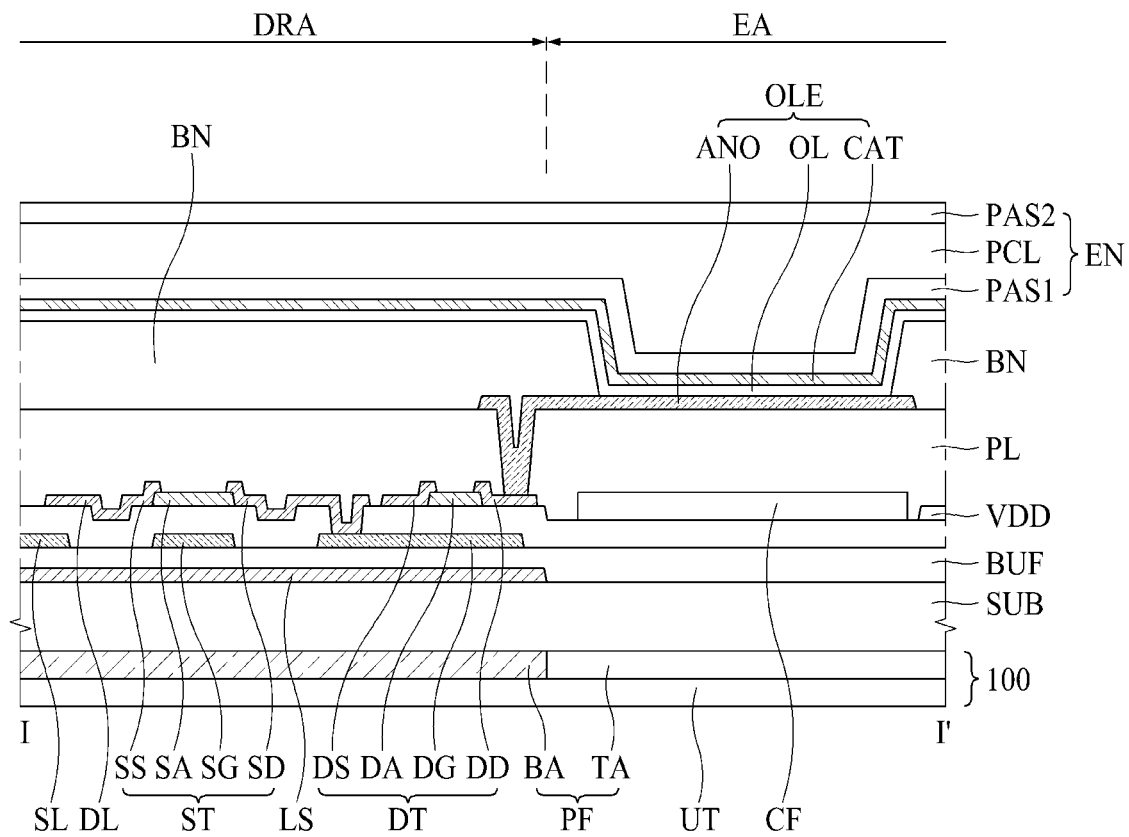
FIG. 4 is a cross-sectional view along to cutting line I-I' in FIG. 3, for illustrating the structure of the electroluminescence display according to the first aspect of the present disclosure.

Hereinafter, referring to FIGS. 3 and 4, an electroluminescence display according to the first aspect of the present disclosure will be explained. FIG. 4 is a cross-sectional view along to cutting line I-I' in FIG. 3, for illustrating the structure of the electroluminescent display according to the first aspect of the present disclosure.

Referring to FIG. 4, a light shielding layer LS may be formed on the surface of the substrate SUB. The light shielding layer LS may be disposed as corresponding to the driving area DRA. The light shielding layer LS may be for preventing the external light from intruding into and affecting on the semiconductor layers of the thin film transistors ST and DT. A buffer layer BUF may be deposited on the light shielding layer LS as covering the whole surface of the substrate SUB.

A switching thin film transistor ST and a driving thin film transistor DT may be formed on the buffer layer BUF. For example, the switching thin film transistor ST may be disposed at the portion where the scan line SL and the data line DL is crossing. The switching thin film transistor ST may include a switching gate electrode SG, a switching source electrode SS and a switching drain electrode SD. The switching gate electrode SG may be connected to the scan line SL. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light emitting diode OLE of the pixel selected by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. The driving source electrode DS may be connected to the driving current line VSS, and the driving drain electrode DD may be connected to an anode electrode ANO of the light emitting diode OLE. A storage capacitance Cst may be disposed at the overlapped area between the driving gate electrode DG of the driving thin film transistor DT and the anode electrode ANO of the light emitting diode OLE.

As shown in FIG. 4, the switching thin film transistor ST and the driving thin film transistor DT may have a bottom gate structure in which the gate electrode SG and DG are firstly formed on the substrate SUB. In this case, the gate insulating layer GI may be deposited on the gate electrodes SG and DG, and the semiconductor layer SA and DA may be formed on the gate insulating layer GI. Further, at both side ends of the semiconductor layer SA and DA, the source electrodes SS and DS and the drain electrodes SD and DD may be formed, respectively. However, it is not limited thereto, but the switching thin film transistor ST and the diving thin film transistor DT may have the top gate structure in which the semiconductor layer may be firstly formed on the substrate SUB.

The planarization layer PL may be deposited on or over the switching thin film transistor ST and the driving thin film transistor DT. The planarization layer PL is for making the top surface of the substrate including the thin film transistors ST and DT being in even condition. The planarization layer PL may be made of an organic material for ensuring the flatness of the top surface of the substrate SUB. In other case, the planarization layer PL may have a multi-layered structure in which at least one inorganic layer and at least one organic layer are alternately stacked.

The driving thin film transistor DT may be disposed between the driving current line VDD and the light emitting diode OLE. The driving thin film transistor DT may control the amount of electric currents flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, a light emitting layer OL and a cathode electrode CAT. The light emitting diode OLE may emit the light according to the amount of the electric current controlled by the driving thin film transistor DT. In other words, the light emitting diode OLE may be driven by the voltage difference between the low-level voltage and the high-level voltage controlled by driving thin film transistor DT.

The anode electrode ANO may be formed on the planarization layer PL covering the thin film transistors ST and DT. The anode electrode ANO may be connected to the driving drain electrode DD of the driving thin film transistor DT through a contact hole formed at the planarization layer PL. The bank BA may be formed on the anode electrode ANO. The bank BA may define the emission area at the anode electrode ANO by covering the circumference of the anode electrode ANO and exposing most central area of the anode electrode ANO.

The light emitting layer OL may be deposited on the top surfaces of the bank BA and the exposed portions of the anode electrode ANO. The light emitting layer OL may include an organic or an inorganic material for generating lights. The light emitting layer OL may be stacked as covering the whole of the display area DA on the substrate SUB. In other case, the light emitting layer OL may be deposited as being separated as corresponding to each emission area defined by the bank BA and as contacting the anode electrode ANO.

The cathode electrode CAT may be deposited on the light emitting layer OL. The light emitting diode OLE may be formed by the stacking structure of the anode electrode ANO exposed by the bank BA, the light emitting layer OL contacting the anode electrode ANO, and the cathode electrode.

The electroluminescence display may have a structure of the bottom emission type in which the lights generated from the light emitting diode OLE radiate in the direction toward the substrate SUB having the thin film transistors ST and DT. In this case, the color filter CF may be further formed under the light emitting diode OLE. For example, the color filter CF may be formed as corresponding to the emission area after forming the thin film transistors ST and DT. After that, the planarization layer PL may be deposited as covering the thin film transistors ST and DT and the color filter CF. However, it is not limited thereto. In another example, the electroluminescence display may have a top emission structure in which the light emitted from the light emitting diode OLE may radiate in the direction toward the encapsulation layer EN formed on the light emitting diode OLE. In that case, the color filter CF may be disposed on or over the light emitting diode OLE.

The encapsulation layer EN may be formed on the top surface of the substrate SUB including the light emitting diode OLE. The encapsulation layer EN is for protecting the light emitting diode OLE from the foreign materials intruded from the external environment.

The encapsulation layer EN may include at least one inorganic layer and at least one organic layer. In one example, the encapsulation layer EN may be formed by sequentially stacking the first inorganic layer PAS1, the organic layer PCL and the second inorganic layer PAS2. The first inorganic layer PAS1 and the second inorganic layer PAS2 may be for preventing the penetration of moisture and gas from the outside environment. The first inorganic layer PAS1 and the second inorganic layer PAS2 may be formed of the inorganic material such as the silicon oxide and silicon nitride. The organic layer PCL may include an organic material for covering the foreign materials.

For the case of the bottom emission type in which the light from the light emitting layer OL emits in the direction toward the substrate SUB, an external light reflection preventing film 100 may be attached at the bottom side of the substrate SUB. The external light reflection preventing film 100 may include a pattern layer PF and an ultraviolet light blocking layer UT.

For example, a pattern layer PF may be attached at the lower surface of the substrate SUB. The pattern layer PF may include a light blocking area BA and a light transmitting area TA. The light blocking area BA may be disposed as corresponding to the driving area DRA. Otherwise, the light blocking area BA may be disposed as corresponding to the light shielding layer LS. Meanwhile, the light transmitting area TA may be disposed as corresponding to the emission area EA.

The pattern layer PF may include a photo decomposition material. In detail, the pattern layer PF may include a dye with long conjugated structure (P-P conjunction) having N═N double bonds. A long-conjugated structure with an N═N double bond may absorb visible light and may not transmit visible light. However, as irradiating with an ultraviolet light, the N═N double bond may be decomposed and the length of the conjugated structure is shortened, so that it may become a transparent state that does not absorb visible light. For example, before UV irradiation, the light transmittance may be 6% or less in an opaque state, but after UV irradiation, the light transmittance may be at least 50% to 99%. Depending on the energy of the irradiated ultraviolet light and the irradiation time, the double bond may be decomposed to control the length of the conjugated structure. As the total energy of the irradiated ultraviolet light increases, the conjugated structure may become shorter and the transparency may increase. The transmittance of visible light may be adjusted between 50% and 99% by controlling the ultraviolet irradiation energy or the ultraviolet irradiation time.

Figure 5:
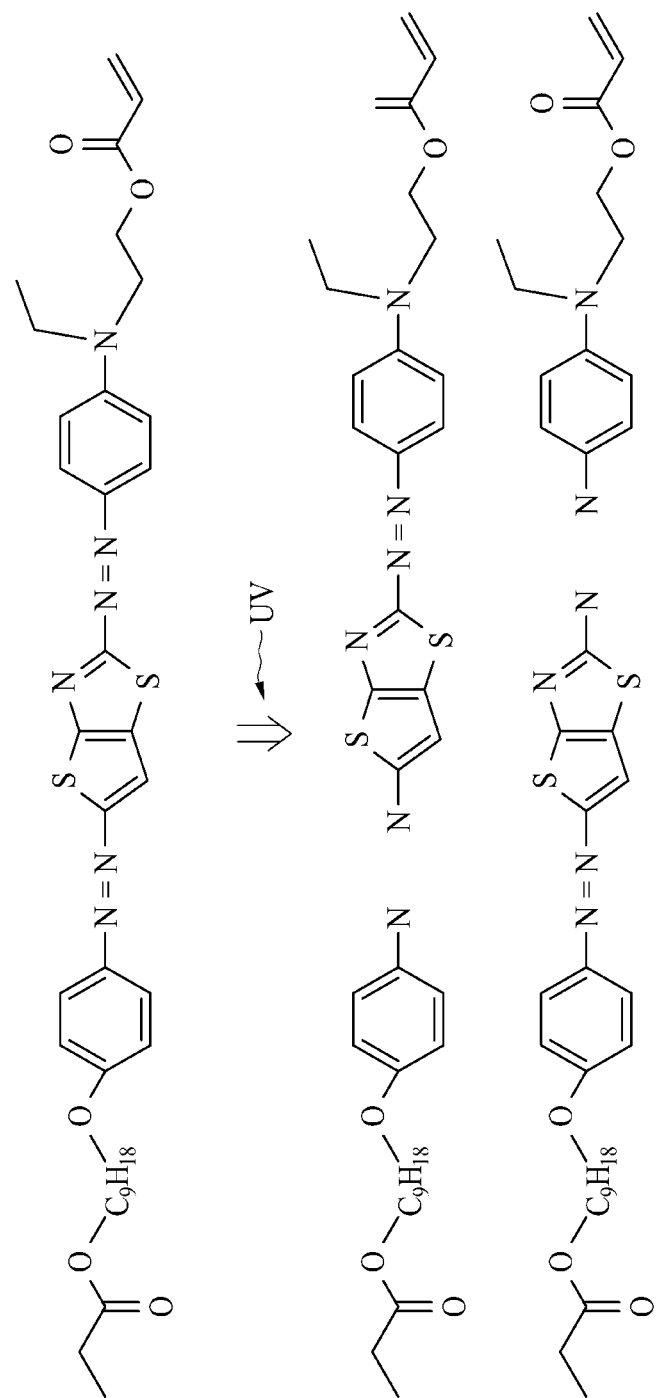
FIG. 5 is a drawing of chemical structure formula explaining a mechanism for changing of the light transmittance of the non-liquid crystalline dye included into the pattern layer according to the present disclosure.

For example, the pattern layer PF may include a non-liquid crystal azo dye. Although the azo dye exhibits a color in a specific wavelength band, it may become transparent when being irradiated with ultraviolet light in a wavelength band of 300 nm to 370 nm. As shown in FIG. 5, the azo dye may have N═N double bond structure. FIG. 5 is a drawing of chemical structure formula explaining a mechanism for changing of the light transmittance of the non-liquid crystalline dye included into the pattern layer according to the present disclosure. When ultraviolet light (UV) may be irradiated here, some N═N double bonds may be decomposed, and the transmittance of visible light may be increased. For one example, as a dye included in the pattern layer PF, a single azo dye may be used, wherein the single azo dye may absorb more than 75% of visible light in the range of 380 nm to 750 nm before UV irradiation, but has higher transmittance for visible light after UV irradiation. For another example, various azo dyes may be mixed and used, wherein the various azo dyes may absorb visible light of specific wavelength band before irradiation of UV light, but the transmittance of visible light of the corresponding wavelength band may be increased after irradiation of UV light.

For an example, the pattern layer PF may include a first azo dye, a second azo dye and a third azo dye. The first azo dye may absorb 75% or more of visible light in a wavelength range of 380 nm to 480 nm by a conjugated structure before irradiation of UV light and may have a transmittance of 85% or more for visible light in other wavelength bands, but when being irradiated with UV light, the transmittance of the first azo with respect to all of the visible light may increase to 90% or more. The second azo dye may absorb 75% or more of visible light in a wavelength range of 480 nm to 600 nm by a conjugated structure before irradiation of UV light and may have a transmittance of 85% or more for visible light in other wavelength bands, but when being irradiated with UV light, the transmittance of the second azo with respect to all of the visible light may increase to 90% or more. In addition, the third azo dye may absorb 75% or more of visible light in a wavelength range of 600 nm to 750 nm by a conjugated structure before irradiation of UV light and may have a transmittance of 85% or more for visible light in other wavelength bands, but when being irradiated with UV light, the transmittance of the third azo with respect to all of the visible light may increase to 90% or more. When the first azo dye, the second azo dye and the third azo dye are mixed to form a film, the film may be made into a black film having the transmittance rate of 6% or less (or absorption rate of 94% or more) with respect to visible light in the 380 nm to 750 nm wavelength band before UV irradiation.

By mixing these three azo dyes, the pattern layer PF may be formed on the bottom surface of the substrate SUB. After that, ultraviolet light may be irradiated to the emission area EA excepting the driving area DRA. As the result, the pattern layer PF may be divided into two areas including the light transmitting area TA corresponding to the emission area EA and the light blocking area BA corresponding to the driving area DRA.

The light transmitting area TA may be patterned as corresponding to the emission area EA only, or corresponding to the emission area EA and the line area LA. The light blocking area BA may be patterned as corresponding to the driving area DRA in any case.

An ultraviolet light blocking layer UT may be further attached on the lower surface of the pattern layer PF. The ultraviolet light blocking layer UT may prevent the light blocking ability or performance of the light blocking area BA from being deteriorated due to UV light included in sunlight incident from the outside of the substrate SUB being irradiated to the pattern layer PF. Further, the ultraviolet light blocking layer UT may be a reinforced film including materials for ultraviolet light screening (or blocking) material. In this case, the ultraviolet light blocking layer UT may prevent the pattern layer PF from being damaged from external impacts or scratches as well as blocking UV light.

Figure 6A:
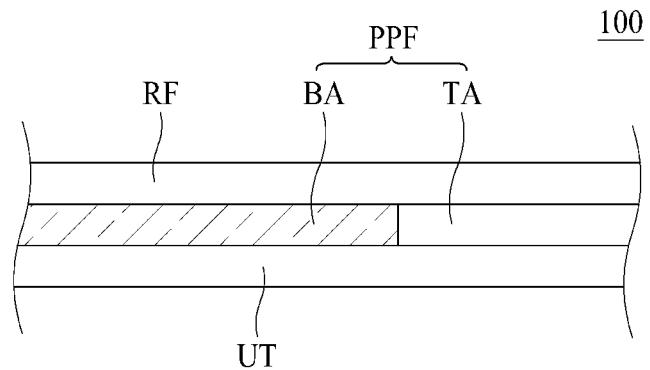
FIGS. 6A to 6C are cross-sectional views illustrating the structure of an external light reflection preventing film provided in an electroluminescence display according to the present disclosure.
Figure 6B:
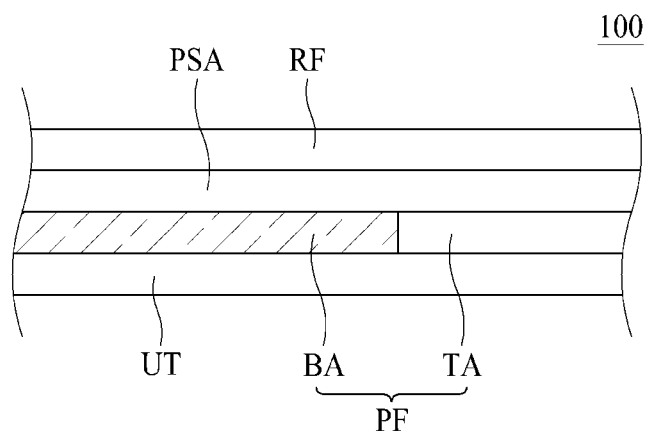
Figure 6C:
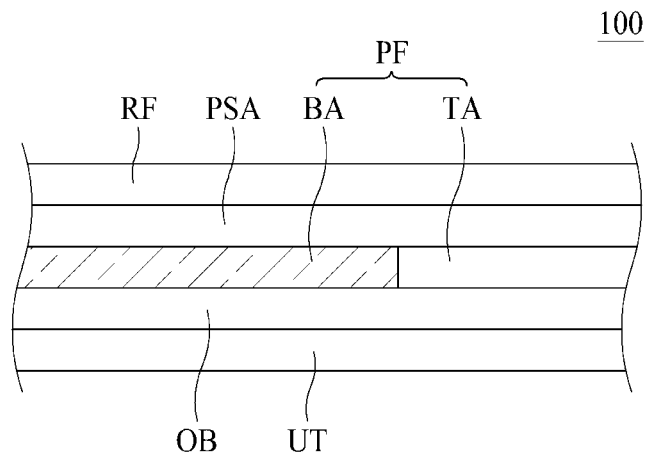

Hereinafter, referring to FIGS. 6A and 6B, the external light reflection protecting film 100 will be explained in detail. FIGS. 6A to 6C are cross-sectional views illustrating the structure of an external light reflection preventing film provided in an electroluminescence display according to the present disclosure. With FIGS. 6A and 6B, various configurations having structures in which the pattern layer PF is formed in a film form and may be attached to the substrate SUB using an additional adhesive layer PSA will be described.

Referring to FIG. 6A, an exemplary external light reflection protecting film 100 may include an ultraviolet light blocking layer UT, an adhesive pattern layer PPF and a release film RF. The ultraviolet light blocking layer UT may be disposed at the topmost layer. The adhesive pattern layer PPF including an adhesive material and an azo dye may be disposed under the ultraviolet light blocking layer UT. FIG. 6A shows a status in which the adhesive pattern layer PPF is patterned as being divided into two portions corresponding to the light blocking area BA and the light transmitting area TA. However, it is not limited thereto. The adhesive pattern layer PPF may be disposed at only the light blocking area BA, before attaching to the substrate SUB or being irradiated with UV light.

In detail, by mixing azo dye with optical clear adhesive (OCA) or pressure sensitive adhesive (PSA), the adhesive pattern layer PPF may be formed. Depositing the adhesive pattern layer PPF on one side of the ultraviolet light blocking layer UT, the release film RF may be deposited on the adhesive pattern layer PPF to protect the adhesive pattern layer PPF. As irradiating UV light on the side where the release film RF is disposed, the light transmitting area TA and the light blocking area BA may be formed at the adhesive pattern layer PPF. After that, the pattern layer PF may be attached on the lower surface of the substrate SUB. FIG. 4 illustrates an electroluminescence display having the external light reflection protecting film 100 as shown in FIG. 6A.

Referring to FIG. 6B, another exemplary external light reflection protecting film 100 may include an ultraviolet light blocking layer UT, a pattern layer PF, an optical adhesive layer PSA and a release film RF. The ultraviolet light blocking layer UT may be disposed at the topmost layer. The pattern layer PF may be disposed under the ultraviolet light blocking layer UT. FIG. 6B shows that the pattern layer PF is patterned as being divided into two portions corresponding to the light blocking area BA and the light transmitting area TA. However, it is not limited thereto. The pattern layer PF may be disposed at only the light blocking area BA, before attaching to the substrate SUB or being irradiated with UV light.

The optical adhesive layer PSA may be disposed under the lower surface of the pattern layer PF. Using the optical adhesive layer PSA, the pattern layer PF may be attached on the lower surface of the substrate SUB. The release film RF may be a film for protecting the optical adhesive layer PSA. After removing the release film RF, the optical adhesive layer PSA of the external light reflection protecting film 100 is attached on the lower surface of the substrate SUB.

Referring to FIG. 6C, still another exemplary external light reflection protecting film 100 may include an ultraviolet light blocking layer UT, an oxygen preventing layer OB, a pattern layer PF, an optical adhesive layer PSA and a release film RF. The explanation about the same elements with those shown in FIG. 6B may not be duplicated. The oxygen preventing layer OB may include materials for absorbing oxygen which may be intruded from external environment. The oxygen preventing layer OB may be a protective layer for preventing oxygen from being intruded into the pattern layer PF. When the azo dye is excessively exposed to oxygen, the property of azo dye may be changed, and the transmittance of light may be changed. In order to prevent this problem, the oxygen preventing layer OB may be disposed on the upper surface of the pattern layer PF.

In the structure shown in FIG. 4, when there is no external light reflection protecting film 100, external light incident from the downward direction of the substrate SUB may be reflected by various elements formed on the substrate SUB and recognized by the observer. Image information provided by the light emitting area EA may not be properly recognized by external light. Although the light shielding layer LS is disposed under the driving area DRA, in order to completely prevent external light reflection, an external light reflection protecting film 100 according to the present disclosure may be further added because about 10% to 15% of light is also reflected from the light shielding layer LS.

Since the light blocking area BA of the pattern layer PF according to the present disclosure has a feature of absorbing visible light using the chemical properties of the dye, the visible light absorption rate may be reduced to 6% or less. In addition, the visible light transmittance in the light transmitting area TA may be freely adjusted according to the energy of the ultraviolet light by controlling the wavelength or the irradiation time of the ultraviolet light.

For example, the light transmitting area TA may have a visible light transmittance of 95% or more. In this case, 95% or more of the light emitted from the light emitting diode OLE is transmitted, so that high luminance may be secured. However, external light incident through the light transmitting area TA may be also reflected by the cathode electrode CAT, and 95% or more of the reflected light may be recognized by the observer.

In order to reduce the amount of external light reflected from the light emitting area EA, the visible light transmittance in the light transmitting area TA may be adjusted to be between 50% and 90%, as explained above. When the visible light transmittance of the light transmitting area TA is lower than 50%, the luminance of light provided by the light emitting diode OLE may be too lowered, and thus display quality may be deteriorated.

The visible light transmittance of the light transmitting area TA may be appropriately adjusted according to the field of the application of the display presented in the present disclosure. For example, the visible light transmittance of the light transmitting area TA may be adjusted as low as possible in a situation in which the observer is exposed as being provided external light having strong luminance. For another example, in the case that the influence from external light is small, such as when the display is mainly used indoors or applied to a vehicle instrument panel, the visible light transmittance of the light transmitting area TA may be adjusted to be high.

Second Aspect

Figure 7:
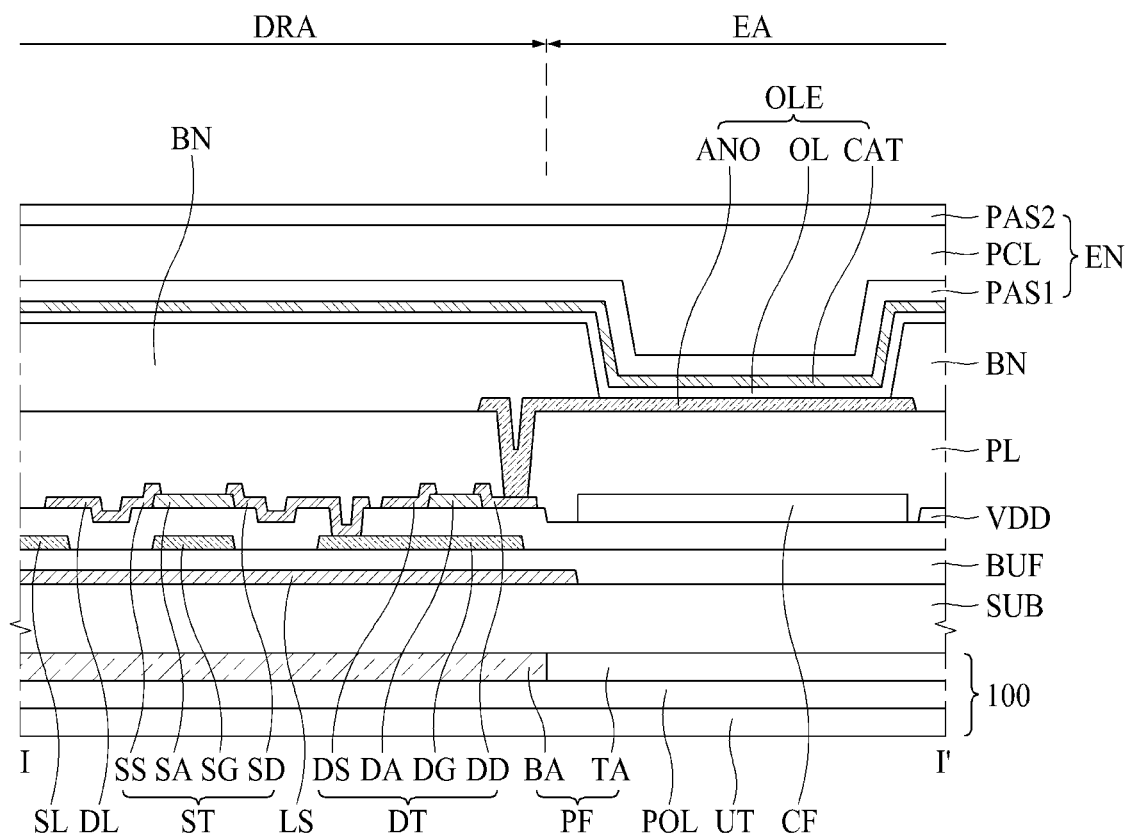
FIG. 7 is a cross-sectional view along to cutting line I-I' in FIG. 3, for illustrating a structure of the electroluminescence display according to the second aspect of the present disclosure.

Hereinafter, referring to FIG. 7, the second aspect according to the present disclosure will be explained. FIG. 7 is a cross-sectional view along to cutting line I-I' in FIG. 3, for illustrating a structure of the electroluminescence display according to the second aspect of the present disclosure. The structure of the electroluminescence display according to the second aspect may be very similar with that of the first aspect. The difference may lie in the structure of the external light reflection protecting film 100. Therefore, unless required, the explanation for the same element may not be duplicated.

Referring to FIG. 7, an electroluminescence display according to the second aspect of the present disclosure may include a substrate SUB, thin film transistors ST and DT, a light emitting diode OLE, an encapsulation layer EN and external light reflection preventing film 100. On the upper surface of the substrate SUB, the thin film transistors ST and DT, the light emitting diode OLE and the encapsulation layer EN may be disposed as stacking sequentially. Under the lower surface of the substrate SUB, the external light reflection preventing film 100 may be attached.

The external light reflection preventing film 100 may include a pattern layer PF, a polarizing layer POL and an ultraviolet light blocking layer UT. The pattern layer PF may include a light blocking area BA and a light transmitting area TA. The light blocking area BA may be disposed as corresponding to the driving area DRA. Otherwise, the light blocking area BA may be disposed as corresponding to the light shielding layer LS. Meanwhile, the light transmitting area TA may be disposed as corresponding to the emission area EA.

The pattern layer PF may include a photo decomposition material. The polarizing layer POL may be disposed under the lower surface of the pattern layer PF. The polarizing layer POL may be an optical film for preventing the external light reflection. The polarizing layer POL may prevent external light from being reflected by using the linear polarizing property of light. However, in the viewing angle range, the polarization angle between the absorption axis of the polarizing layer POL and the linearly polarized reflected light traveling at the viewing angle is shifted, so that the reflected light may be leaked. Accordingly, in the second aspect of the present disclosure, the reflection of external light may be more effectively prevented by using the combination of the polarizing layer POL and the pattern layer PF.

Especially, the polarizing layer POL may prevent the external light incident into the light transmitting area TA from being reflected. Accordingly, even when the visible light transmittance of the light transmitting area TA in the pattern layer PF is adjusted to 95% or more, the external light reflection may be suppressed. As the result, the electroluminescence display according to the second aspect may minimize external light reflection and maximize the luminous efficiency of light emitted from the light emitting diode OLE.

The ultraviolet light blocking layer UT may be attached under the lower surface of the polarizing layer POL. The ultraviolet light blocking layer UT may prevent the light blocking performance of the light blocking area BA from being deteriorated due to ultraviolet light included in sunlight incident from the outside of the substrate SUB being irradiated to the pattern layer PF.

In the second aspect explained with FIG. 7, the adhesive layer is not included in the external light reflection preventing film 100. This case may be the case in which the external light reflection preventing film 100 may be formed by using the adhesive pattern layer PPF as shown in FIG. 6A. However, it is not limited thereto, for other examples, the external light reflection preventing film 100 may include the optical adhesive layer PSA, as shown in FIGS. 6B and 6C.

Third Aspect

Figure 8:
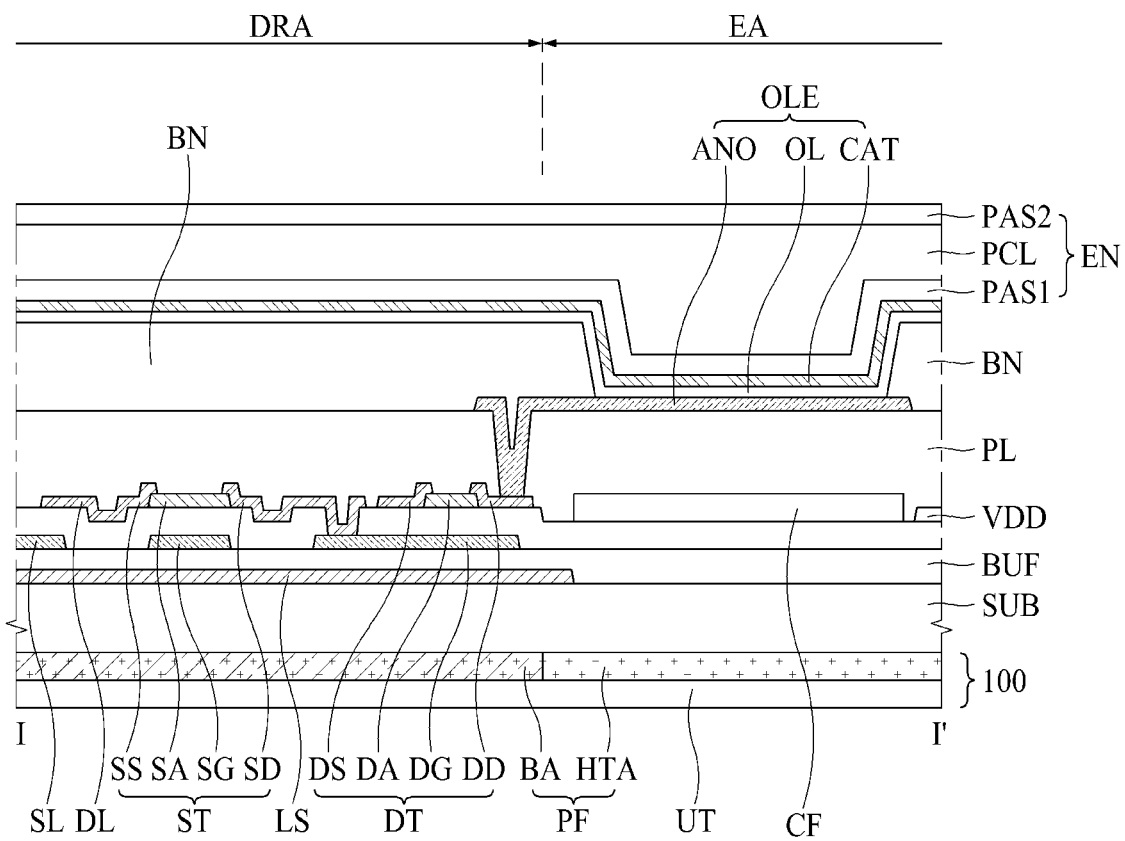
FIG. 8 is a cross-sectional view along to cutting line I-I' in FIG. 3, for illustrating a structure of the electroluminescence display according to the third aspect of the present disclosure.

Hereinafter, referring to FIG. 8, the third aspect according to the present disclosure will be explained. FIG. 8 is a cross-sectional view along to cutting line I-I' in FIG. 3, for illustrating a structure of the electroluminescence display according to the third aspect of the present disclosure. The structure of the electroluminescence display according to the third aspect may be very similar with that of the first aspect. The difference may lie in the structure of the external light reflection protecting film 100. Therefore, unless required, the explanation for the same element may not be duplicated.

Referring to FIG. 8, an electroluminescence display according to the third aspect of the present disclosure may include a substrate SUB, thin film transistors ST and DT, a light emitting diode OLE, an encapsulation layer EN and external light reflection preventing film 100. On the upper surface of the substrate SUB, the thin film transistors ST and DT, the light emitting diode OLE and the encapsulation layer EN may be disposed as stacking sequentially. Under the lower surface of the substrate SUB, the external light reflection preventing film 100 may be attached.

The external light reflection preventing film 100 may include a pattern layer PF and an ultraviolet light blocking layer UT. The pattern layer PF may include a light blocking area BA and a semi-light transmitting area HTA. The light blocking area BA may be disposed as corresponding to the driving area DRA. Otherwise, the light blocking area BA may be disposed as corresponding to the light shielding layer LS. Meanwhile, the semi-light transmitting area HTA may be disposed as corresponding to the emission area EA.

The pattern layer PF may include a non-liquid crystal azo dye and a light absorbing material. Here, the light absorbing material may be a dye or a pigment which absorbs visible light having a wavelength range of 380 nm to 780 nm. By irradiating ultraviolet light to the pattern layer PF, the light blocking area BA and the semi-light transmitting area HTA may be defined. The light blocking area BA may be in state in which the azo dye absorbs visible light by irradiation of ultraviolet light. On the other hand, the semi-light transmitting area HTA contains a light absorbing material, so the amount of light passing through the semi-light transmitting area HTA may be set to be reduced by 20% to 50% by adjusting the content of the light absorbing material.

For example, the semi-light transmitting area HTA may include a light absorbing material to reduce the amount of light transmitted there-through by 30%. In this case, about 70% of external light incident into the semi-light transmitting area HTA may pass through the semi-light transmitting area HTA. After that, the transmitted light may be reflected by the cathode electrode CAT, and pass through the semi-light transmitting area HTA again, so that about 70% of the reflected light may pass out of the semi-light transmitting area HTA. Accordingly, about 49% of the total amount of external light may be reflected and provided to the observer. That is, the external light incident into the semi-light transmitting area HTA may be reduced by 50% or more. Meanwhile, the amount of light provided from the light emitting diode OLE emitted to the semi-light transmitting area HTA may be reduced by about 30%. As the result, the transmittance of light provided from the light emitting diode OLE may be secured as high as possible, and the reflectance of external light may be suppressed at the same time.

The ultraviolet light blocking layer UT may be attached at the lower surface of the pattern layer PF. The ultraviolet light blocking layer UT may prevent the light blocking performance of the light blocking area BA from being deteriorated by sunlight incident from the outside of the substrate SUB. In addition, the ultraviolet light blocking layer UT may prevent the pattern layer PF from being damaged by an external impact.

In the third aspect explained with FIG. 8, the adhesive layer is not included in the external light reflection preventing film 100. This case may be the case in which the external light reflection preventing film 100 may be formed by dispersing a certain amount of a light absorbing material on the adhesive pattern layer PPF as shown in FIG. 6A. However, it is not limited thereto, for other examples, the external light reflection preventing film 100 may include the optical adhesive layer PSA, as shown in FIGS. 6B and 6C.

Fourth Aspect

Figure 9:
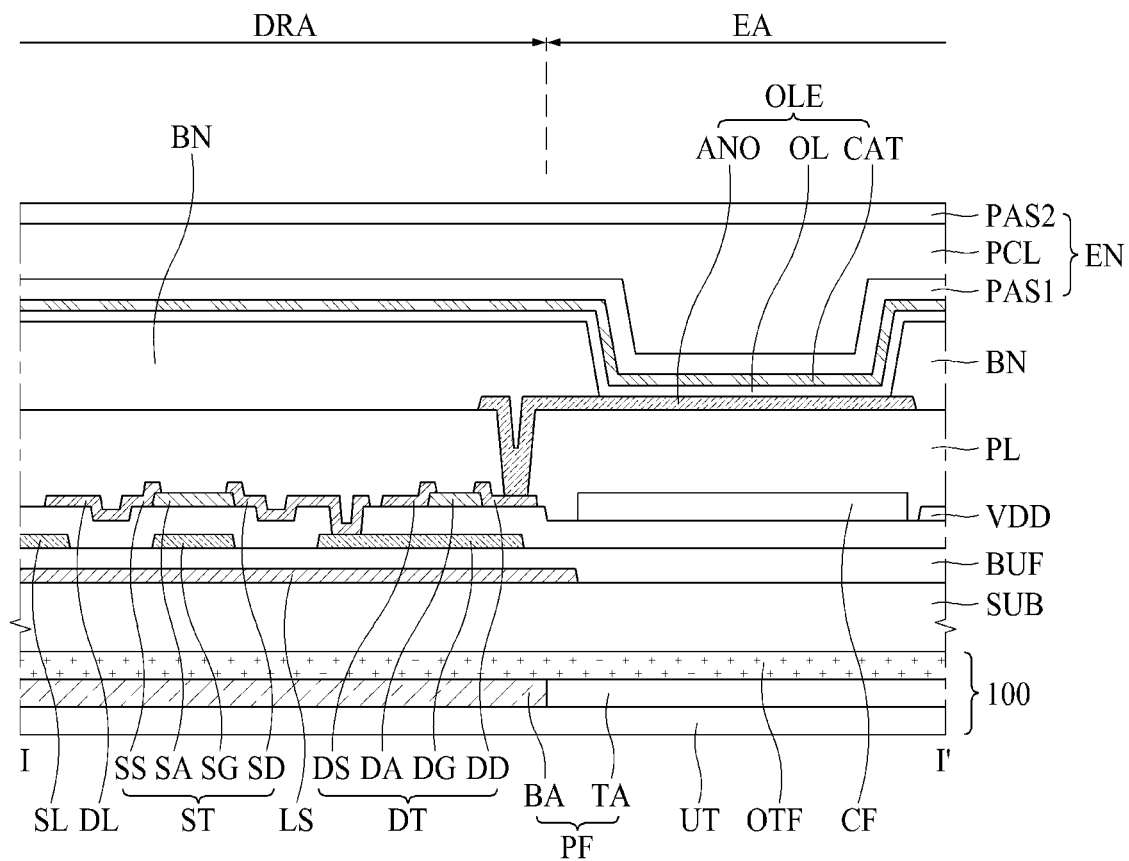
FIG. 9 is a cross-sectional view along to cutting line I-I' in FIG. 3, for illustrating a structure of the electroluminescence display according to the fourth aspect of the present disclosure.

Hereinafter, referring to FIG. 9, the fourth aspect according to the present disclosure will be explained. FIG. 9 is a cross-sectional view along to cutting line I-I' in FIG. 3, for illustrating a structure of the electroluminescence display according to the fourth aspect of the present disclosure. The structure of the electroluminescence display according to the fourth aspect may be very similar with that of the first aspect. The difference may lie in the structure of the external light reflection protecting film 100. Therefore, unless required, the explanation for the same element may not be duplicated.

Referring to FIG. 9, an electroluminescence display according to the fourth aspect of the present disclosure may include a substrate SUB, thin film transistors ST and DT, a light emitting diode OLE, an encapsulation layer EN and external light reflection preventing film 100. On the upper surface of the substrate SUB, the thin film transistors ST and DT, the light emitting diode OLE and the encapsulation layer EN may be disposed as stacking sequentially. Under the lower surface of the substrate SUB, the external light reflection preventing film 100 may be attached.

The external light reflection preventing film 100 may include a light absorbing layer OTF, a pattern layer PF and an ultraviolet light blocking layer UT. The pattern layer PF may include a light blocking area BA and a light transmitting area TA. The light blocking area BA may be disposed as corresponding to the driving area DRA. Otherwise, the light blocking area BA may be disposed as corresponding to the light shielding layer LS. Meanwhile, the light transmitting area TA may be disposed as corresponding to the emission area EA.

The optical absorbing layer OTF may include a light absorbing material. Here, the light absorbing material may be a dye or a pigment which absorbs visible light having a wavelength range of 380 nm to 780 nm. The light absorbing layer OTF may have a light absorptivity of 70% or less (or light transmittance of 30% or more) with respect to visible light in a wavelength band of 380 nm to 780 nm. For example, by adjusting the content of the light absorbing material in the light absorbing layer OTF, the transmittance of light passing through the light transmitting area TA may be set to be 20% to 60%.

For example, the light absorbing layer OTF may include a light absorbing material to reduce the amount of light transmitted there-through by 30%. In this case, about 70% of external light incident into the light transmitting area TA may pass through the light absorbing layer OTF. After that, the transmitted light may be reflected by the cathode electrode CAT, and pass through the light absorbing layer OTF again, so that about 70% of the reflected light may pass out of the light absorbing layer OTF. Accordingly, about 49% of the total amount of external light may be reflected and provided to the observer. In addition, considering that the transmittance of the light transmitting area TA may be adjusted between 50% and 99%, the reflectance of external light incident into the light transmitting area TA may be reduced much more than 50%. Meanwhile, the amount of light provided from the light emitting diode OLE emitted to the semi-light transmitting area HTA may be reduced by about 30%. As the result, the transmittance of light provided from the light emitting diode OLE may be secured as high as possible, and the reflectance of external light may be suppressed at the same time.

The light absorbing layer OTF may be made in a film type by mixing a light absorbing material with an adhesive material. For example, a light absorbing material may be mixed with the adhesive layer PSA of the external light reflection preventing film 100 shown in FIG. 6B or FIG. 6C to form a light absorbing layer OTF.

The ultraviolet light blocking layer UT may be attached at the lower surface of the pattern layer PF. The ultraviolet light blocking layer UT may prevent the light blocking performance of the light blocking area BA from being deteriorated by sunlight incident from the outside of the substrate SUB. In addition, the ultraviolet light blocking layer UT may prevent the pattern layer PF from being damaged by an external impact.

In the fourth aspect explained with FIG. 9, the external light reflection preventing film 100 may be made by dispersing a certain amount of a light absorbing material in the adhesive layer PSA as shown in FIG. 6A. However, it is not limited thereto, for other examples, the external light reflection preventing film 100 may be made by replacing the polarizing layer POL in the second aspect as shown in FIG. 7 with the light absorbing layer OTF.

Fifth Aspect

Figure 10:
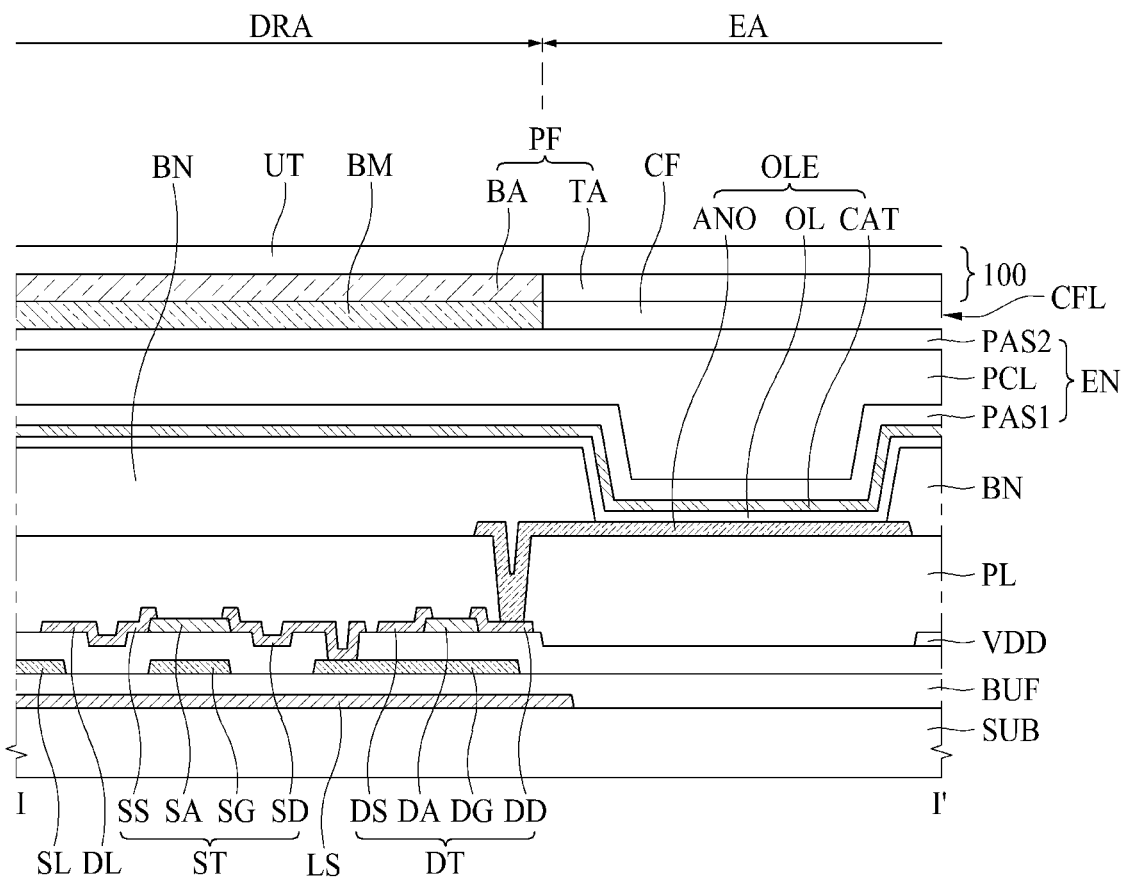
FIG. 10 is a cross-sectional view along to cutting line I-I' in FIG. 3, for illustrating a structure of the electroluminescence display according to the fifth aspect of the present disclosure.

Hereinafter, referring to FIG. 10, the fifth aspect according to the present disclosure will be explained. FIG. 10 is a cross-sectional view along to cutting line I-I' in FIG. 3, for illustrating a structure of the electroluminescence display according to the fifth aspect of the present disclosure. Until now, in the aspects, a bottom emission type has been described. However, it is not limited thereto, and the external light reflection preventing film 100 may be applied to a top emission type. The top emission type refers to a structure in which light generated from the light emitting diode OLE is emitted in the direction toward the encapsulation layer EN in the structurer shown in FIG. 4.

In this case, the observer may see the display in the direction of the encapsulation layer EN. Therefore, the external light reflection preventing film 100 may be disposed at the top surface of the encapsulation layer EN.

For example, an electroluminescence display according to the fifth aspect of the present disclosure may include a substrate SUB, thin film transistors ST and DT, a light emitting diode OLE, a color filter layer CFL, an encapsulation layer EN and external light reflection preventing film 100. On the upper surface of the substrate SUB, the thin film transistors ST and DT, the light emitting diode OLE and the encapsulation layer EN may be disposed as stacking sequentially. The color filter layer CFL may be disposed on the encapsulation layer EN.

The color filter layer CFL may include a color filter CF and a black matrix BM. The color filter CF may be disposed as corresponding to the emission area EA, and the black matrix BM may be disposed as corresponding to the driving area DRA. For another example, even though it is not shown in figures, the color filter layer CFL may be disposed between the cathode electrode CAT and the encapsulation layer EN.

The external light reflection preventing film 100 may be attached on the top surface of the color filter layer CFL. The external light reflection preventing film 100 may include a pattern layer PF and an ultraviolet light blocking layer UT. The pattern layer PF may include a light blocking area BA and a light transmitting area TA. The light blocking area BA may be disposed as corresponding to the driving area DRA. Meanwhile, the light transmitting area TA may be disposed as corresponding to the emission area EA.

The ultraviolet light blocking layer UT may be attached at the lower surface of the pattern layer PF. The ultraviolet light blocking layer UT may prevent the light blocking performance of the light blocking area BA from being deteriorated by sunlight incident from the outside of the substrate SUB.

In addition, the ultraviolet light blocking layer UT may prevent the pattern layer PF from being damaged by an external impact.

Even though it is not shown in figures, a display including a touch sensing layer may comprise the external light reflection preventing film 100 according to the present disclosure. For example, the touch sensing layer may be disposed between the color filter layer CFL and the external light reflection preventing film 100.

In addition, a cover film may be included. In this case, the cover film may be attached on the external light reflection preventing film 100. For another example, the cover film may be combined with the ultraviolet light blocking layer UT as being in one film or one plate.

The electroluminescence display according to the present disclosure described above may be characterized by using a non-liquid crystal dye that increases light transmittance by irradiating ultraviolet light. Compared to the case of using a dye of which light absorption rate increases with irradiation of ultraviolet light, safety of the device may be very excellent. For example, as the non-liquid crystal dye according to the present disclosure may be used for a long time, the light absorption rate may not be degraded according to environmental changes such as temperature, so that quality of display may be constantly maintained.

The features, structures, effects and so on described in the above examples of the present disclosure are included in at least one example of the present disclosure, and are not limited to only one example. Furthermore, the features, structures, effects and the likes explained in at least one example may be implemented in combination or modification with respect to other examples by those skilled in the art to which this disclosure belongs. Accordingly, contents related to such combinations and variations should be construed as being included in the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An electroluminescence display comprising:
    a substrate including a plurality of pixels, each pixel having an emission area and a non-emission area;
    a light emitting diode disposed in the emission area;
    an encapsulation layer covering the light emitting diode; and
    a pattern layer including a light transmitting area corresponding to the emission area and a light blocking area corresponding to the non-emission area, and disposed at a first direction from the substrate,
    wherein the first direction is corresponding to a light emitting direction of light which is generated by the light emitting diode,
    wherein the pattern layer includes a non-liquid crystal dye which transmits visible light as a length of a conjugated structure is shortened by irradiating a ultraviolet light of a specific wavelength,
    wherein the light transmitting area has a first transmittance of visible light of 50% or more by shortening the length of the conjugated structure of the non-liquid crystal dye, and
    wherein the light blocking area has a second transmittance of visible light of 25% or less by maintaining the length of the conjugated structure of the non-liquid crystal dye.

2. The electroluminescence display according to claim 1, wherein the specific wavelength of the ultraviolet light is selected from a wavelength range of 300 nm to 370 nm.

3. The electroluminescence display according to claim 1, wherein the non-liquid crystal dye includes:
    a first dye, which has a first light absorption rate of 75% or more with respect to the visible light in a wavelength band of 380 nm to 480 nm before irradiating the ultraviolet light;
    a second dye, which has a second light absorbing rate of 75% or more with respect to the visible light in a wavelength band of 480 nm to 600 nm before irradiating the ultraviolet light; and
    a third dye, which has a third light absorbing rate of 75% or more with respect to the visible light in a wavelength band of 600 nm to 750 nm before irradiating the ultraviolet light.

4. The electroluminescence display according to claim 3, wherein after irradiating the ultraviolet light,
    the first dye has the first transmittance of 50% to 99% with respect to the visible light in the wavelength band of 380 nm to 480 nm,
    the second dye has the second transmittance of 50% to 99% with respect to the visible light in the wavelength band of 480 nm to 600 nm, and
    the third dye has the third transmittance of 50% to 99% with respect to the visible light in the wavelength band of 600 nm to 750 nm.

5. The electroluminescence display according to claim 1, wherein the non-liquid crystal dye includes azo dye.

6. The electroluminescence display according to claim 1, further comprising an ultraviolet light blocking layer disposed at the first direction from the pattern layer.

7. The electroluminescence display according to claim 6, further comprising an oxygen preventing layer disposed between the pattern layer and the ultraviolet light blocking layer.

8. The electroluminescence display according to claim 6, further comprising an optical film disposed between the pattern layer and the ultraviolet light blocking layer.

9. The electroluminescence display according to claim 8, wherein the optical film includes one of a polarizing layer and a light absorbing layer.

10. The electroluminescence display according to claim 9, wherein the light emitting diode emits light to a direction where the substrate is disposed, and
    wherein the pattern layer is disposed under a lower surface of the substrate.

11. The electroluminescence display according to claim 1, wherein the light emitting diode emits light to a direction where the encapsulation layer is disposed, and
    wherein the pattern layer is disposed on a top surface of the encapsulation layer.

12. The display according to claim 1, wherein the pattern layer further includes a light absorbing material.

13. An electroluminescence display comprising:
- a substrate including a plurality of pixels, each pixel having an emission area and a non-emission area;
- a light emitting diode disposed in the emission area of each pixel over the substrate; and
- a pattern layer disposed under the substrate, and including a light transmitting area corresponding to the emission area and a light blocking area corresponding to the non-emission area;
- an optical film disposed under the pattern layer; and
- an ultraviolet light blocking layer disposed under the optical film, the optical film including one of a polarizing layer and a light absorbing layer, wherein the light emitting diode emits light in a direction toward the substrate.

14. An electroluminescence display comprising:
- a substrate including a plurality of pixels, each pixel having an emission area and a non-emission area;
- a light emitting diode disposed in the emission area of each pixel over the substrate;
- an encapsulation layer covering the light emitting diode;
- a pattern layer disposed over the encapsulation layer and including a light transmitting area corresponding to the emission area and a light blocking area corresponding to the non-emission area;
- an optical film disposed over the pattern layer; and
- an ultraviolet light blocking layer disposed over the optical film, the optical film including one of a polarizing layer and a light absorbing layer,
- wherein the light emitting diode emits light in a direction toward the encapsulation layer.

* * * * *